US008664851B2

(12) United States Patent
Jeon et al.

(10) Patent No.: US 8,664,851 B2
(45) Date of Patent: Mar. 4, 2014

(54) ELECTRONIC DEVICE, ORGANIC LIGHT EMITTING DEVICE, AND PROTECTION MULTILAYER STRUCTURE

(75) Inventors: Aekyung Jeon, Goyang-si (KR); Jaeyoon Lee, Seoul (KR); Jongkyun Lee, Goyang-si (KR)

(73) Assignee: LG. Display Co., Ltd., Seoul (KR)

( * ) Notice: Subject to any disclaimer, the term of this patent is extended or adjusted under 35 U.S.C. 154(b) by 282 days.

(21) Appl. No.: 12/893,699

(22) Filed: Sep. 29, 2010

(65) Prior Publication Data
US 2011/0156578 A1 Jun. 30, 2011

(30) Foreign Application Priority Data

Dec. 30, 2009 (KR) ........................ 10-2009-0134634

(51) Int. Cl.
*H01J 1/62* (2006.01)
*B32B 7/02* (2006.01)
*H05K 1/16* (2006.01)

(52) U.S. Cl.
USPC ........... 313/506; 313/500; 313/501; 313/502; 313/503; 313/504; 313/505

(58) Field of Classification Search
USPC ........ 313/495–512; 428/690, 917; 315/169.3, 315/169.4
See application file for complete search history.

(56) References Cited

U.S. PATENT DOCUMENTS

| 5,757,126 A * | 5/1998 | Harvey et al. ................ 313/506 |
| 2003/0190763 A1* | 10/2003 | Cok et al. ........................ 438/22 |
| 2007/0114521 A1* | 5/2007 | Hayashi et al. ................ 257/40 |
| 2008/0218066 A1* | 9/2008 | Kim .............................. 313/504 |
| 2008/0309226 A1* | 12/2008 | Kim et al. ..................... 313/504 |

FOREIGN PATENT DOCUMENTS

CN 1399502 A 2/2003

OTHER PUBLICATIONS

Office Action issued in corresponding Chinese Patent Application No. 201010219956.2, mailed Nov. 14, 2012.

* cited by examiner

*Primary Examiner* — Anh Mai
*Assistant Examiner* — Elmito Breval
(74) *Attorney, Agent, or Firm* — Brinks Gilson & Lione

(57) ABSTRACT

Provided is an electronic device including a substrate, a pixel located on the substrate and defined by a bank layer, and a multilayer protection film placed on the pixel and composed of multiple layers including at least one organic layer. The thickness of the first organic layer of the multiple layers forming the multilayer protection film satisfies $T \geq k \times H \times W$ where T represents the thickness of the first organic layer, H denotes the height of the bank layer, and k is a constant that is varied according to flowability or viscosity of the first organic layer.

12 Claims, 12 Drawing Sheets a thickness of the organic layer(1000 Å )/
a thickness of the inorganic layer(16000 Å )/
a thickness of the organic layer(1000 Å )/

US 8,664,851 B2

ELECTRONIC DEVICE, ORGANIC LIGHT EMITTING DEVICE, AND PROTECTION MULTILAYER STRUCTURE

This application claims the benefit of Korea Patent Application No. 10-2009-0134634, filed on Sep. 30, 2009, the entire contents of which is incorporated herein by reference for all purposes as if fully set forth herein.

BACKGROUND

1. Field of the Invention
This disclosure relates to an electronic device.

2. Discussion of the Related Art
Electronic devices include various protection units for protecting the electronic devices from external physical and chemical impacts.

As the areas of these electronic devices increase, attempts to improve, modify or change the protection units are made to solve problems caused by the increase in the areas of the electronic devices or meet various requirements of consumers.

However, these attempts cannot solve the problems or satisfy the requirements.

BRIEF SUMMARY

An electronic device includes a substrate, a pixel located on the substrate and defined by a bank layer, and a multilayer protection film placed on the pixel and composed of multiple layers including at least one organic layer, wherein the thickness of the first organic layer of the multiple layers forming the multilayer protection film satisfies $T \geq k \times H \times W$ where T represents the thickness of the first organic layer, H denotes the height of the bank layer, and k is a constant that is varied according to flowability or viscosity of the first organic layer.

BRIEF DESCRIPTION OF THE DRAWINGS

The implementation of this invention will be described in detail with reference to the following drawings in which like numerals refer to like elements.

DETAILED DESCRIPTION OF THE DRAWINGS AND THE PRESENTLY PREFERRED EMBODIMENTS

Hereinafter, an implementation of this invention will be described in detail with reference to the attached drawings.

Figure 1:
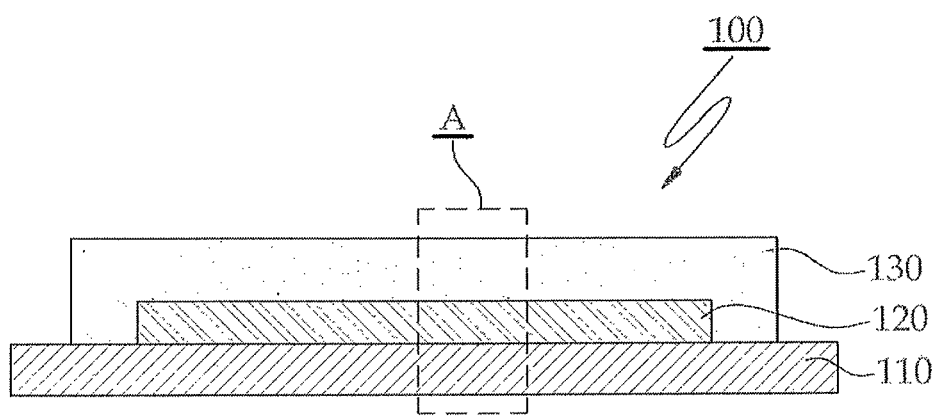
FIG. 1 is a cross-sectional view of an electronic device.

FIG. 1 is a cross-sectional view of an implementation of an electronic device 100.

Referring to FIG. 1, the electronic device 100 includes a substrate 110, a pixel 120, and a multilayer protection film 130.

The electronic device 100 may be a display device, a light emitting device, a semiconductor device, a cell or the like. The display device may be an organic electronic device such as an organic light emitting diode (OLED), an organic solar cell, an organic photoreceptor (OPC) drum, an organic transistor (organic TFT), a photodiode, an organic laser, a laser diode or the like. The light emitting device may be an inorganic electronic device such as a light emitting diode (LED).

The cell may be a solar cell such as a silicon solar cell, an inorganic solar cell using an inorganic material such as compound semiconductors (CIGS, CdTe, GaAs and the like), and an organic solar cell having a part of an organic material or the entire organic material. Furthermore, the cell may be primary and secondary cells such as a solid electrolyte cell, an air cell, a reversible cell, a Galvani cell, a photochemical cell, a lead storage battery, a storage battery, a concentration cell, a manganese dry cell, a mercury battery, a fuel cell, a layer-build dry cell, a bichromate cell, a lithium polymer battery and the like.

The substrate 10 is used to form the pixel 120 and may have high mechanical strength or dimensional stability. The material of the substrate 110 may include a glass plate, a metal plate, a ceramic plate, and a plastic plate (made of polycarbonate resin, acryl resin, polyvinyl chloride, polyimide resin, polyester resin, epoxy resin, silicon resin or fluororesin). However, the material of the substrate 110 is not limited thereto. The substrate 110 may be flexible. The flexible substrate 110 may be used for a flexible electronic device.

The pixel 120 is located on the substrate 110. The pixel 120 may have a structure and a configuration according to the type of the electronic device 100. For example, the pixel 120 may be a light emitting element when the electronic device 100 is a display device and may be a light receiving element when the electronic device 100 is a solar cell.

The multilayer protection film 130 covers the pixel 120 and includes at least one organic layer and at least one of an inorganic layer and a moisture-absorbing layer, which are laminated. The multilayer protection film 130 may be formed in such a manner that an organic layer and an inorganic layer are alternately laminated.

An organic light emitting device will be explained as an example of the electronic device 100. However, the inventive concept is not limited thereto and may be applied to any electronic device such as an LED, an organic solar cell, and a secondary battery.

The organic light emitting device used for an organic light emitting display is a self-emission device having an emission layer formed between two electrodes placed on a substrate. The organic light emitting display is classified into a top-emission type, a bottom-emission type, and a dual-emission type according to the direction in which the organic light emitting display emits lights. Furthermore, the organic light emitting display may be classified into a passive matrix type and an active matrix type according to the driving method of the organic light emitting display.

An active matrix type organic light emitting diode (AMOLED) includes a switching transistor, a driving transistor, a capacitor, an anode, an organic emission layer, and a cathode.

An AMOLED 200 used for an organic light emitting device will now be explained as an example of the electronic device 100 with reference to FIGS. 2 and 3.

Figure 2:
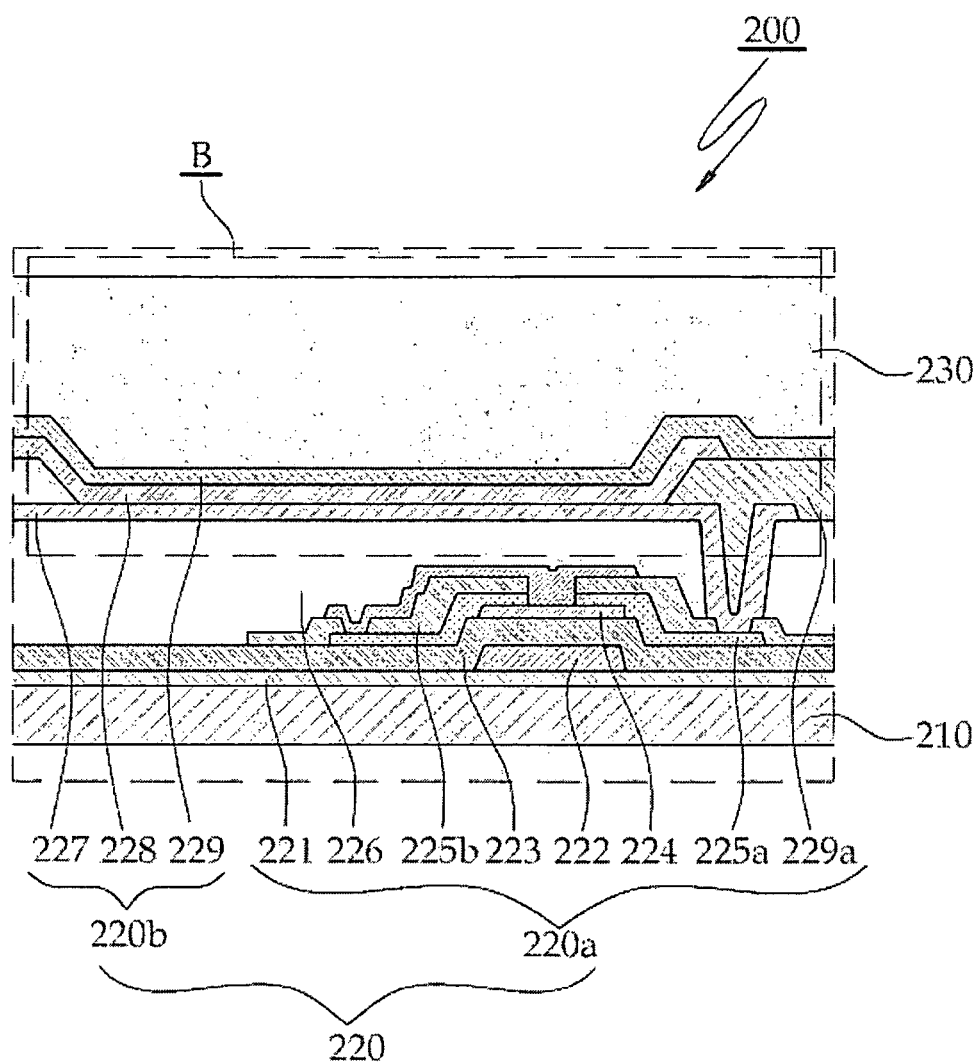
FIG. 2 is an enlarged cross-sectional view of a region A of FIG. 1 when the electronic device shown in FIG. 1 corresponds to an implementation of an active matrix organic light emitting diode (AMOLED)
Figure 3:
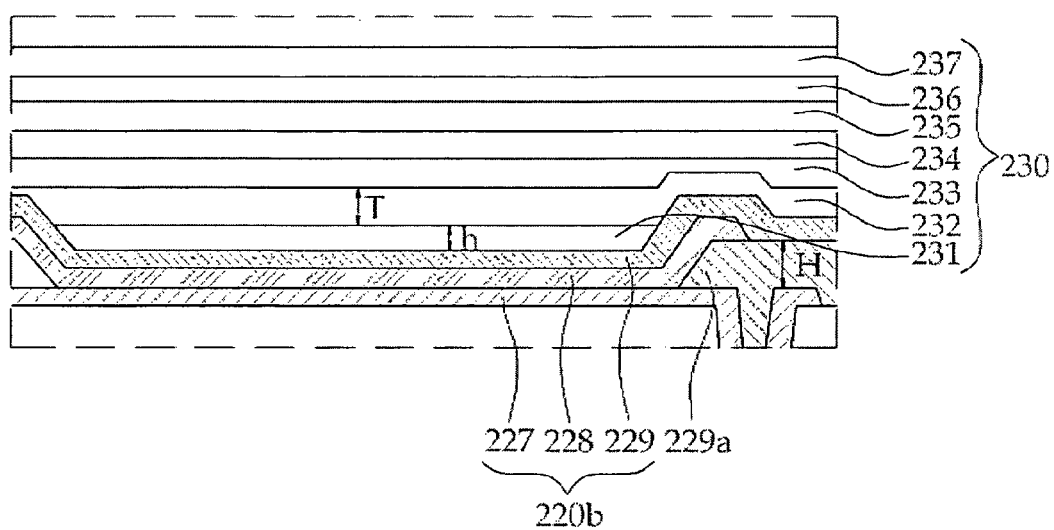
FIG. 3 is an enlarged cross-sectional view of a region B of FIG. 2.
Figure 4:
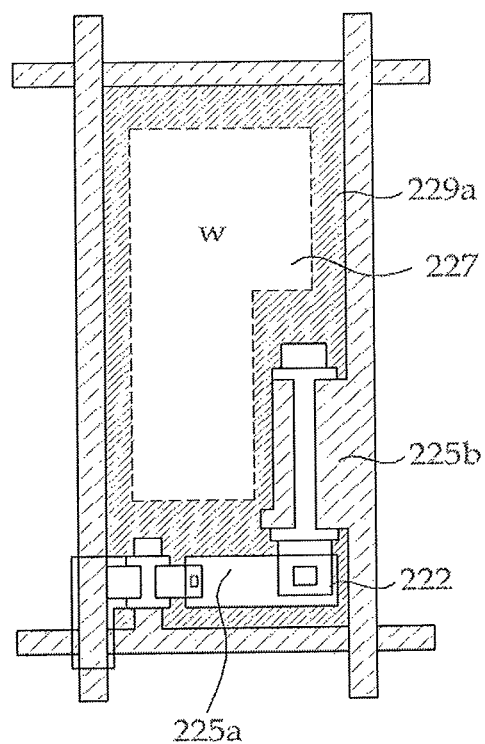
FIG. 4 is a plan view of the region A of FIG. 1 when the electronic device shown in FIG. 1 corresponds to the AMOLED.

FIG. 2 is an enlarged cross-sectional view of a region A of FIG. 1, which shows a part of the AMOLED 200, FIG. 3 is an enlarged cross-sectional view of a region B of FIG. 2, and FIG. 4 is a plan view of the region A of FIG. 1.

Referring to FIGS. 2, 3 and 4, the AMOLED 200 includes a substrate 210, a pixel 220, and a multilayer protection film 230. The pixel 220 includes a transistor 220a and an OLED 220b.

The transistor 220a formed on the substrate 210 includes a buffer layer 221, a gate 222, a first insulating layer 223, an active layer 224, a source 225a, a drain 225b, and a second insulating layer 226.

The buffer layer 221 may be placed on the substrate 110. The buffer 221 may be formed to protect a thin film transistor which will be formed through a subsequent process from impurities such as alkali ions discharged from the substrate 210. The buffer layer 221 may use silicon oxide ($SiO_2$), silicon nitride (SiNx) and the like.

The gate 222 may be placed on the buffer layer 221. The gate 222 may be formed of one selected from a group consisting of Mo, Al, Cr, Au, Ti, Ni, Nd and Cu or an alloy of these materials. Furthermore, the gate 222 may be a multi-layer formed of one selected from a group consisting of Mo, Al, Cr, Au, Ti, Ni, Nd and Cu or an alloy of these materials. In addition, the gate 222 may be a double layer of Mo/Al—Nd or Mo/Al.

The first insulating layer 223 may be placed on the gate 222. The first insulating layer 223 may be formed of silicon oxide (SiOx), silicon nitride (SiNx) or a multi-layer of the silicon oxide and silicon nitride. However, the material of the first insulating layer 223 is not limited thereto.

An active layer 224 may be located on the first insulating layer 223. The active layer 224 may include amorphous silicon or polysilicon. The active layer 224 may include a channel region (not shown), a source region (not shown), and a drain region (not shown) and the source region and the drain region may be doped with a P-type or N-type impurity.

Furthermore, the active layer 224 may include an ohmic contact layer for reducing contact resistance.

The source 225a and the drain 225b may be formed on the active layer 224.

The source 225a and the drain 225b may be formed in the form of a single layer or a multi-layer. When the source 225a and the drain 225b are formed as a single layer, the source 225a and the drain 225b may be formed of one selected from a group consisting of Mo, Al, Cr, Au, Ti, Ni, Nd and Cu or an alloy of these materials. When the source 225a and the drain 225b are formed as a multi-layer, the source 225a and the drain 225b may be a double layer of Mo/Al—Nd or a tri-layer of Mo/Al/Mo or Mo/Al—Nd/Mo.

The second insulating layer 226 may be located on the source 225a and the drain 225b. Although the second insulating layer 226 may be a silicon oxide (SiOx) layer, a silicon nitride (SiNx) layer or a multi-layer of SiOx and SiNx, the second insulating layer 226 is not limited thereto. The second insulating layer 226 may be a passivation layer.

A bottom gate type transistor has been explained as an example of the transistor 220a formed on the substrate 210.

The OLED 220b located on the transistor 220a will now be explained. The OLED 220b includes a first electrode 227, a second electrode 229, and an organic emission layer 228.

The first electrode 227 may be placed on the second insulating layer 226. The first electrode 227 may be selected as an anode and made of transparent indium tin oxide (ITO) or indium zinc oxide (IZO). However, the first electrode 227 is not limited these material.

A bank layer 229a may be placed on the first electrode 227. The bank layer 229a may include an organic material such as benzocyclobutene (BCB) resin, acrylic resin or polyimide resin. The bank layer 229a has an opening placed on the first electrode 227. The bank layer 229a has a specific height H.

The opening of the bank layer 229a has a specific area W corresponding to the size of the pixel 220. The area W of the opening of the bank layer 229a defines the area of the organic emission layer 228.

The organic emission layer 228 may be placed in the opening of the bank layer 229a. The organic emission layer 228 may be located on the first electrode 227 in the opening of the bank layer 229a. Here, a part of the organic emission layer 228 may be formed on the bank layer 229a other than the opening of the bank layer 229a during a process of forming the organic emission layer 228.

The organic emission layer 228 may emit one of red, green and blue lights according to the pixel 220.

The second electrode 229 may be placed on the organic emission layer 228. The second electrode 229 may be selected as a cathode and formed of metal such as Al, Ca or Mg, or a transparent material such as ITO or IZO.

The multilayer protection film 230 is located on the pixel 220 to cover the pixel 220.

The multilayer protection film 230 is formed in such a manner that first, second, third and fourth inorganic layers 231, 233, 235 and 237 and first, second and third organic layers 232, 234 and 236 are alternately laminated. To implement a large-area flexible organic light emitting device, the multilayer protection film 230 is formed to achieve passivation using multilayer thin films because it is difficult to use a sheet type getter to remove oxygen and moisture infiltrated into the organic light emitting device from the outside.

The first, second, third and fourth inorganic layers 231, 233, 235 and 237 may be formed of $Al_2O_3$, SiNx, $SiO_2$, SiOx, SiON, SiOxNy and SiC. However, the materials of the first, second, third and fourth inorganic layers 231, 233, 235 and 237 are not limited thereto. When the first, second, third and fourth inorganic layers 231, 233, 235 and 237 are formed of SiNx, stress characteristic may be varied by controlling a flow rate of $H_2$ gas during a SiNx layer forming process.

The first, second, third and fourth inorganic layers 231, 233, 235 and 237 may be formed of the same material or different materials.

The first, second and third organic layers 232, 234 and 236 may be formed of any depositable material. The first, second and third organic layers 232, 234 and 236 may be formed of a material selected from a group consisting of benzocyclobutene (BCB) or acryl resin, polyimide and poly trimethylene 2,6-naphthalate (PTN). However, the materials of the first, second and third organic layers 232, 234 and 236 are not limited thereto. The first, second and third organic layers 232, 234 and 236 may be formed of the same material or different materials. The first, second and third organic layers 232, 234 and 236 may have a dense molecular structure such that the first, second and third organic layers 232, 234 and 236 have less or no pin hole.

The inventor confirmed that the height of the bank layer 229a, the area of the opening of the bank layer 229a or the organic emission layer 228 (referred to as the area of the opening hereinafter since the area of the opening is equal to the area of the organic emission layer), the entire thickness of the multilayer protection film 230, the materials of the inorganic layers 231, 233, 235 and 237 and the organic layers 232, 234 and 236, and the thicknesses of the inorganic layers 231, 233, 235 and 237 and the organic layers 232, 234 and 236 were closely connected through experiments and researches. The structures of the pixel 220 and the multilayer protection film 230 according to the connection will now be explained.

Figure 5A:
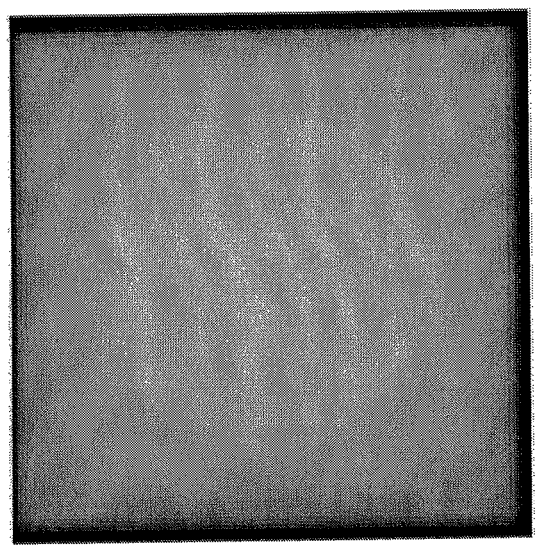
FIGS. 5A and 5B show visibility according to the thickness of each layer of a multilayer protection film and the area of an organic emission layer of the AMOLED shown in FIG. 2.
Figure 5B:
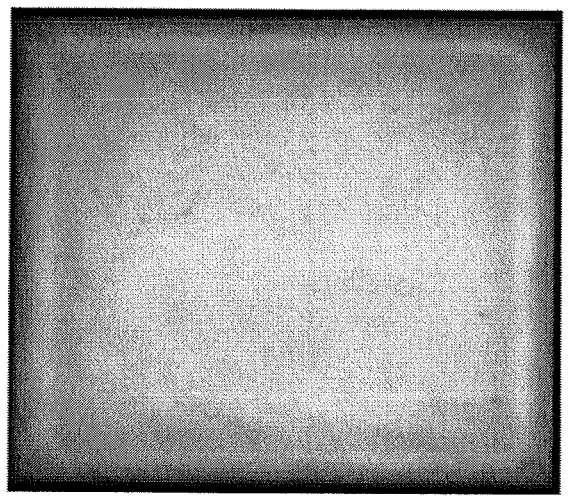

FIGS. 5A and 5B show visibility according to the thickness of each layer of the multilayer protection film and the area of the organic emission layer of the OLED shown in FIG. 2.

FIGS. 5A and 5B show the visibility of the pixel 220, which is confirmed under the condition of Table 1.

TABLE 1

| | Condition | FIG. 5A | FIG. 5B |
|---|---|---|---|
| Bank layer | Thickness of bank layer | 16000 Å | 16000 Å |
| Area of organic emission layer | Area of organic emission layer | $0.185 \times 0.185$ mm$^2$ | $3 \times 3$ mm$^2$ |
| Thickness of each layer of multilayer protection film | Thickness of first inorganic layer | 1000 Å | 1000 Å |
| | Thickness of first organic layer | 5000 Å | 5000 Å |
| | Thickness of second inorganic layer | 1000 Å | 1000 Å |
| | Thickness of second organic layer | 5000 Å | 5000 Å |
| | Thickness of third inorganic layer | 1000 Å | 1000 Å |
| | Thickness of third organic layer | 5000 Å | 5000 Å |
| | Thickness of fourth inorganic layer | 1000 Å | 1000 Å |

It can be confirmed from FIGS. 5A and 5B that an uneven portion in the form of a picture frame is generated at the edge of the organic emission layer 228. This causes picture frame effect. The picture frame effect is observed by a microscope and becomes distinct when the OLED is turned on. Furthermore, R, G and B pixels have different visibilities, and thus the picture frame effect varies according to the R, G and B pixels.

It was confirmed whether the picture frame effect is caused by the entire thickness of the multilayer protection film 230 and/or the thicknesses of the inorganic layers and organic layers.

TABLE 2

| | Condition | (a) | (b) | (c) |
|---|---|---|---|---|
| Bank layer | Thickness of bank layer | 1600 Å | 1600 Å | 1600 Å |
| Area of organic emission layer | Area of organic emission layer | $0.185 \times 0.185$ mm$^2$ | $0.185 \times 0.185$ mm$^2$ | $0.185 \times 0.185$ mm$^2$ |
| Thickness of each layer of multilayer protection film | Thickness of first inorganic layer | 1000 Å | 1000 Å | 1000 Å |
| | Thickness of first organic layer | 5000 Å | 16000 Å | 5000 Å |
| | Thickness of second inorganic layer | 1000 Å | 1000 Å | x |

Figure 6A:
FIGS. 6A, 6B and 6C show visibility of the organic light emitting device shown in FIG. 2, which is confirmed under the conditions (a), (b) and (c) of Table 2.
Figure 6B:
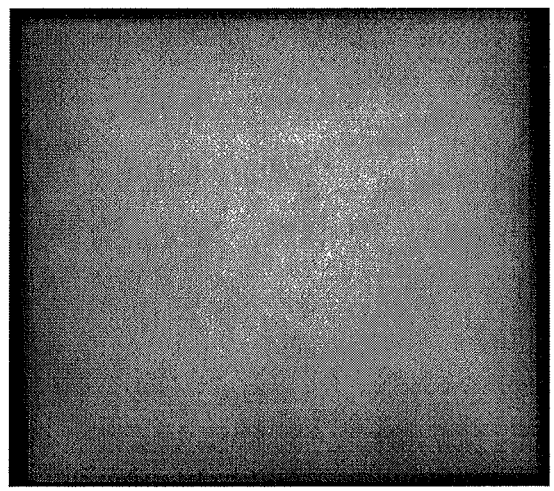
Figure 6C:
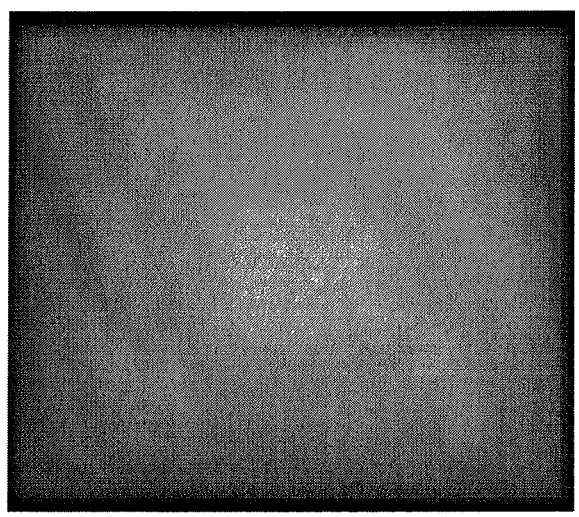

The visibility of the pixel 220, confirmed under the condition of Table 2, is shown in FIGS. 6A, 6B and 6C.

Figure 7A:
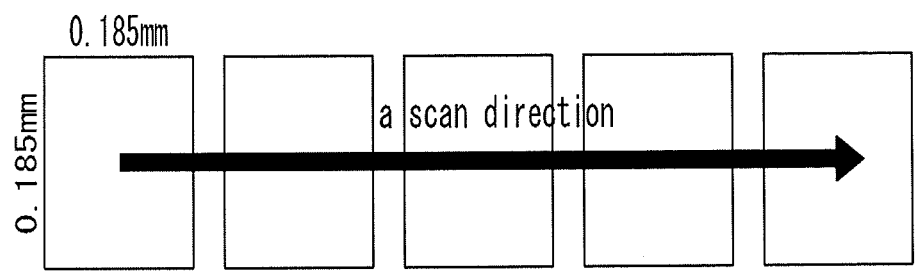
FIG. 7A illustrates a process of scanning pixels in a specific direction to measure the thickness of the multilayer protection film under the conditions (a), (b) and (c) of Table 2.
Figure 7B:
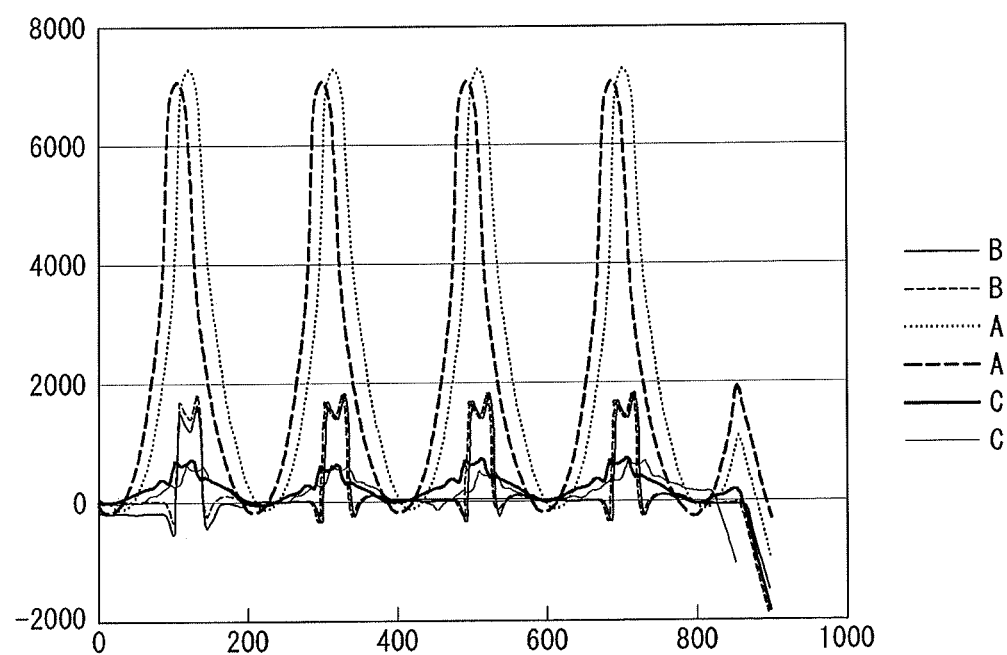
FIG. 7B is a graph showing a result obtained when the thickness of the multilayer protection film is measured according to the process shown in FIG. 7A.

Pixels are scanned in a specific direction, as shown in FIG. 7A, to measure the thickness of the multilayer protection film 230 under the condition of Table 2. FIG. 7B shows the measured thickness of the multilayer protection film 230. In FIG. 7B, a curved line A shows a case that the first organic layer 228 has a thickness of 5000 Å, a curved line B shows a case that the first organic layer 228 has a thickness of 16000 Å, and a curved line C shows a case that the multilayer protection film 230 is relatively thick.

Referring to FIGS. 6C and 7B, though the surface of the multilayer protection film is planarized as the thickness of the multilayer protection layer 230 increases, which can be confirmed by the curved line C of FIG. 7B, the picture frame effect is still generated, as shown in FIG. 6C.

Referring to FIGS. 6A and 6B, the picture frame effect is not generated as the thickness of the first organic layer 228 increases from 5000 Å to 16000 Å while the inorganic layers have the same thickness of 1000 Å. Furthermore, it can be confirmed by the curved lines A and B of FIG. 7B that the surface of the multilayer protection film 230 is planarized under the condition (b) of Table 2 rather than the condition (c) of Table 2.

It can be known from the aforementioned results that the degree of the picture frame effect depends on the thickness of the initially deposited first organic layer 232 rather than the entire thickness of the multilayer protection film 230.

Figure 7C:
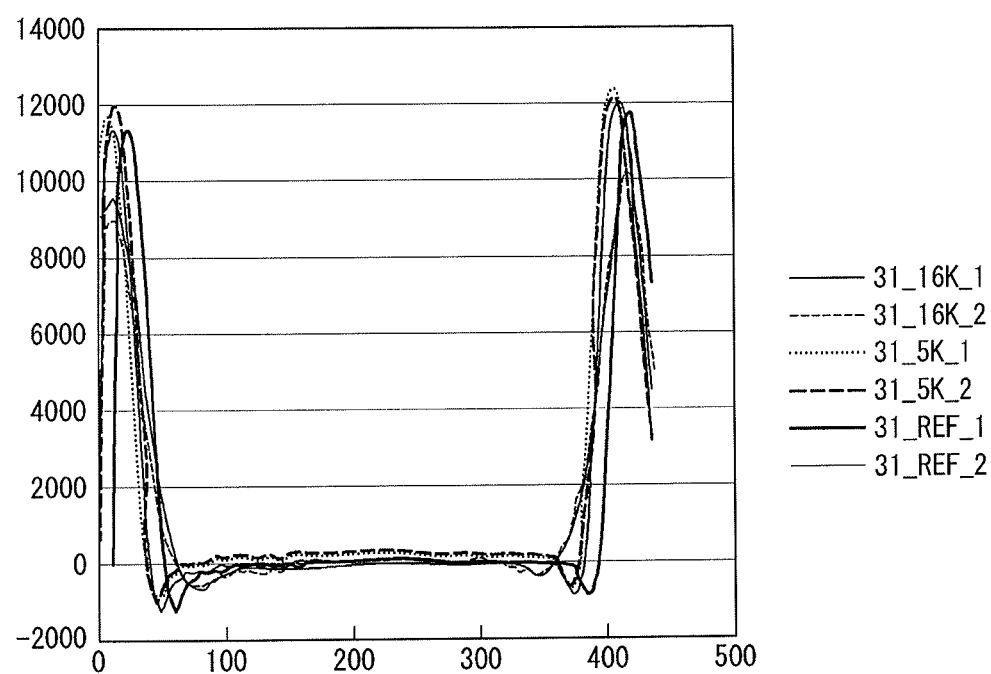
FIG. 7C is a graph showing a result obtained by observing variations in the thicknesses of a bank layer and the organic emission layer of the AMOLED shown in FIG. 2 under the conditions (a), (b) and (c) of Table 2.

Variations in the thicknesses of the bank layer 229a and the multilayer protection film 230 were observed under the conditions (a), (b) and (c) of Table 2. In FIG. 7C, curved lines 31_REF, 31_5K and 31_16K represent pixels under the conditions corresponding to the curved lines C, A and B of FIG. 7B. Referring to FIG. 7C, the picture frame effect is generated when the first organic layer 232 of the multilayer protection film 230 does not planarize a stepped portion of the bank layer 229a. Specifically, the curved line 31_5K of FIG. 7C shows that the possibility that the first organic layer 232 is spread out to the bottom of the stepped portion of the bank layer 229a is low since the first organic layer 232 is thin so as to result in an uneven portion in the form of a picture frame. On the contrary, the curve line 31_16K of FIG. 7C shows that the first organic layer 232 is spread out to the bottom of the stepped portion of the bank layer 229a since the first organic layer 232 is sufficiently thick, and thus the uneven portion in the form of a picture frame is not generated.

Whether the picture frame effect is generated or not was confirmed when only the height of the bank layer 229a and the thickness of the first organic layer were changed while the other conditions were identical to those of Tables 1 and 2. The confirmation result is shown in Table 3. Here, the area of the organic emission layer 228 was 0.185×0.185 nm f. In Table 3, 0 represents that the picture frame effect is generated and X represents that the picture frame effect is not generated.

TABLE 3

| | T | | | | | | | |
|---|---|---|---|---|---|---|---|---|
| H | 5000 | 10000 | 10000 | 13000 | 15000 | 16000 | 17000 | 19000 |
| 14000 | 0 | 0 | 0 | X | X | X | X | X |
| 15000 | 0 | 0 | 0 | 0 | X | X | X | X |
| 16000 | 0 | 0 | 0 | 0 | X | X | X | X |
| 17000 | 0 | 0 | 0 | 0 | 0 | X | X | X |
| 18000 | 0 | 0 | 0 | 0 | 0 | 0 | X | X |
| 19000 | 0 | 0 | 0 | 0 | 0 | 0 | 0 | X |

Referring to Table 3, the thickness of the first organic layer 232, which does not generate the picture frame effect, is proportional to the height of the bank layer 229a.

Whether the picture frame effect is generated or not was confirmed when only the thickness of the first organic layer and the area of the organic emission layer 228 were changed while the other conditions were identical to those of Tables 1 and 2. The confirmed result is shown in Table 4. Here, the height of the bank layer is 16000 Å In Table 3, 0 represents that the picture frame effect is generated and X represents that the picture frame effect is not generated.

TABLE 4

| | T | | | | | | | | |
|---|---|---|---|---|---|---|---|---|---|
| A | 12000 | 13000 | 14000 | 15000 | 16000 | 17000 | 18000 | 19000 | 20000 |
| 0.185 × 0.185 | 0 | X | X | X | X | X | X | X | X |
| 1.5 × 1.5 | 0 | 0 | X | X | X | X | X | X | X |
| 2.5 × 2.5 | 0 | 0 | 0 | X | X | X | X | X | X |
| 3 × 3 | 0 | 0 | 0 | 0 | X | X | X | X | X |
| 3.5 × 3.5 | 0 | 0 | 0 | 0 | 0 | X | X | X | X |
| 4 × 4 | 0 | 0 | 0 | 0 | 0 | 0 | X | X | X |

Referring to FIG. 4, the picture frame effect is not generated when the first organic layer 232 becomes thick as the area of the organic emission layer 228 increases.

The thickness of the first organic layer 232, which does not generate the picture frame effect, is affected by the thickness of a protection layer located under the first organic layer 232, for example, the first inorganic layer 231, as well as the thickness of the bank layer 229a and the area of the organic emission layer 228. Furthermore, the first organic layer 232 may have high flowability (low viscosity) such that the first organic layer 232 is spread out to the bottom of the stepped portion of the bank layer 229a to planarize the stepped portion of the bank layer 229a. The first organic layer 232 may be formed of a monomer rather than a polymer since the monomer has flowability higher than that of the polymer. The flowability increases as molecular weight decreases. Accordingly, the first organic layer 232 may be formed of a monomer having a small molecular weight. However, the first organic layer 232 is not limited thereto.

The thickness of the bank layer 229a, the area of the organic emission layer 282, the thickness of the first inorganic layer 231 located under the first organic layer 232 and the flowability of the first organic layer 232, which are related to the thickness of the first organic layer 232, are represented by expressions as follows.

The thickness T of the first organic layer 232 located on the first inorganic layer 231 may be represented by Expression 1 when the area of the opening of the bank layer 229a is W.

$$T \geq k \times H \times W \quad \text{[Expression 1]}$$

Here, k is a constant varied according to the flowability of the first organic layer 232 and the thickness of the first inorganic layer 231 placed under the first organic layer 232, which may be represented by Expression 2.

$$K = k(fx, tm) \quad \text{[Expression 2]}$$

Here, fx represents the flowability of the first organic layer 232, that is, a degree of flowing of the first organic layer 232 from the bank layer 229a to the opening, and tm denotes the thickness of the first inorganic layer 231 placed under the first organic layer 232.

The thickness T of the first organic layer 232 may be represented by Expression 3 derived from Expressions 1 and 2.

$$T \geq k(fx, tm) \times H \times W \quad \text{[Expression 3]}$$

Since the thickness T of the first organic layer 232 is largely affected by the thickness H of the bank layer 229a, Expression 3 can be simplified into Expression 4 if only the thickness of the first inorganic layer 231 is considered and other variables are not considered.

$$T \geq H - h \quad \text{[Expression 4]}$$

Here, h represents the thickness of the first inorganic layer 231.

As described above, the multilayer protection film 230 has the first, second, third and fourth inorganic layers 231, 233, 235 and 237 and the first, second and third organic layers 232, 234 and 236, which are alternately laminated. Here, the first organic layer 232 can have a thickness that satisfies at least one of Expressions 1, 3 and 4.

For example, when the thicknesses of the bank layer 229a, the first inorganic layer, the first organic layer, the second inorganic layer, the second organic layer, the third inorganic layer, the third organic layer and the fourth inorganic layer are respectively 16000 Å, 1000 Å, 16000 Å, 1000 Å, 5000 Å, 1000 Å, 5000 Å and 1000 Å, the first organic layer 232 is made of PTN, and the area of the organic emission layer 227 is 3×3 mm², the thickness T of the first organic layer 232 satisfies Expression 4, as represented by Expression 5. Accordingly, the picture frame effect is not generated.

$$16000 \text{ Å} \geq 16000 \text{ Å} - 1000 \text{ Å} = 15000 \text{ Å}$$

The OLED having a bottom gate type transistor has been described with reference to FIGS. 2, 3 and 4. However, the inventive concept is not limited thereto. An OLED having a top gate type transistor will now be explained with reference to FIGS. 4, 8 and 9.

Figure 8:
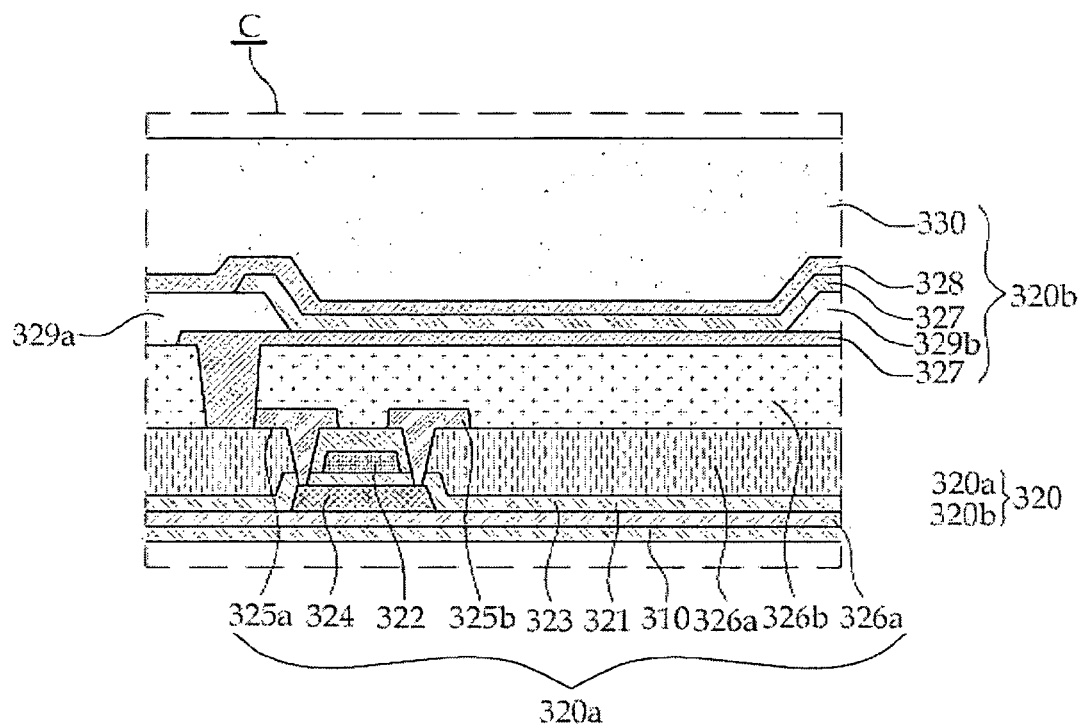
FIG. 8 is an enlarged cross-sectional view of the region A of FIG. 1 when the electronic device shown in FIG. 1 corresponds to another implementation of the AMOLED.
Figure 9:
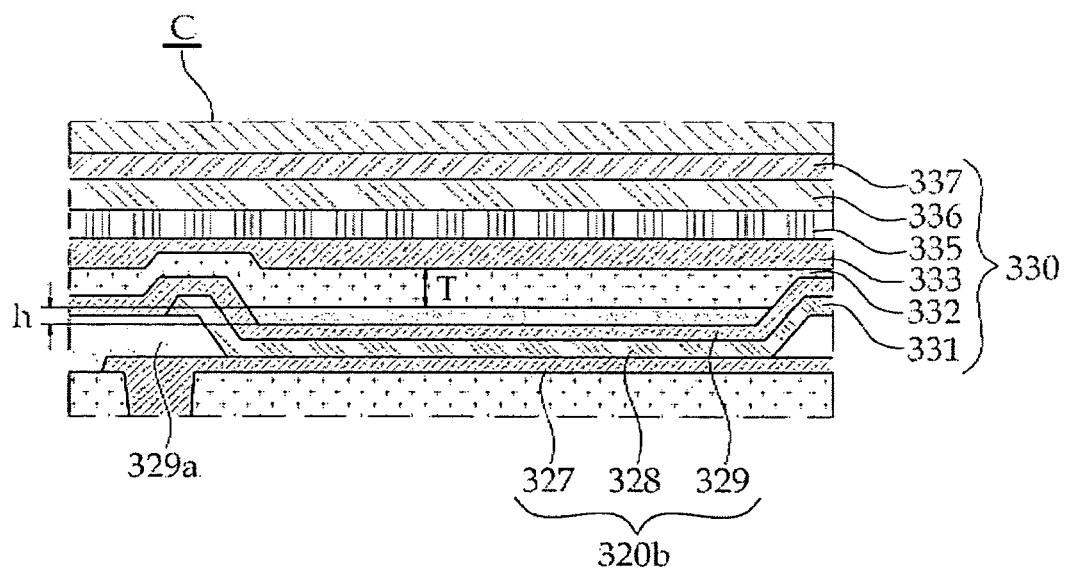
FIG. 9 is an enlarged plan view of a region C shown in FIG. 8.

FIG. 8 is an enlarged cross-sectional view of the region A of FIG. 1 when the electronic device shown in FIG. 1 corresponds to an AMOLED 300 and FIG. 9 is an enlarged cross-sectional view of a region C of FIG. 8.

Referring to FIG. 8, the AMOLED 300 includes a substrate 310, a pixel 320, and a multilayer protection film 330. The pixel includes a top gate type transistor 320a and an OLED 320b.

The transistor 320a formed on the substrate 310 includes a buffer layer 321, a gate 322, a first insulating layer 323, an active layer 324, a source 325a, a drain 325b, a second insulating layer 326a, and a third insulating layer 326b. Only a difference between the transistor 320a and the transistor 220a shown in FIG. 2 is explained and detailed description of the transistor 320a is omitted.

The buffer layer 321 may be formed on the substrate 310. The active layer 324 may be placed on the buffer layer 321. The active layer 324 may include an ohmic contact layer (not shown) for reducing contact resistance. The first insulating layer 323 may be formed on the active layer 324.

The gate 322 may be located on the first insulating layer 323. The second insulating layer 326a may be placed on the gate 322. The source 325a and the drain 325b in contact with the active layer 324 may be formed on the second insulating layer 326a. The third insulating layer 326b may be placed on the source 325a and the drain 325b. The third insulating layer 326b may be an organic layer or an inorganic layer and may function as a planarization layer for improving flatness.

The top gate type transistor 320a formed on the substrate 310 has been described.

The OLED 320b placed on the transistor 320a will now be explained. The OLED 320b includes a first electrode 327, a second electrode 329, and an organic emission layer 328.

The first electrode 327 connected to the source 325a or the drain 325b may be formed on the third insulating layer 326b. A bank layer 329a may be formed on the first electrode 327. The bank layer 329a has an opening placed on the first electrode 327.

The organic emission layer 328 may be placed in the opening of the bank layer 329a. The organic emission layer 328 may emit one of red, green and blue lights according to the pixel 320.

The second electrode 329 may be formed on the organic emission layer 328. The multilayer protection film 330 is placed on the pixel 320 to cover the pixel 320.

Referring to FIG. 9, the multilayer protection film 330 includes first, second, third and fourth inorganic layers 331, 333, 335 and 337 and first, second and third organic layers 332, 334 and 336, which are alternately laminated.

When the first organic layer 322 of the multilayer protection film 330 is not thick enough to planarize a stepped portion of the bank layer 329a, the picture frame effect is generated. When the first organic layer 332 is thin, the possibility that the first organic layer 332 is spread out to the bottom of the stepped portion of the bank layer 329a is low, and thus an uneven portion in the form of a picture frame is generated.

However, the first organic layer 322 is sufficiently thick in this implementation, and thus the first organic layer 332 is spread out to the bottom of the stepped portion of the bank layer 329a to planarize the stepped portion of the bank layer 329a. Accordingly, the uneven portion in the form of a picture frame is not generated.

The thickness of the first organic layer 322, which does not generate the picture frame effect is affected by the thickness of a protection layer located under the first organic layer 322, that is, the first inorganic layer, as well as the thickness of the bank layer 329a and the area of the organic emission layer 328. Furthermore, the first organic layer 322 may have high flowability (low viscosity) so as to be spread out to the bottom of the stepped portion of the bank layer 329a to planarize the stepped portion of the bank layer 329a. The first organic layer 322 may be made of a monomer rather than a polymer since the monomer has flowability higher than that of the polymer. Flowability increases as molecular weight increases. Accordingly, the first organic layer 332 may be formed of a monomer with a small molecular weight. However, the material of the first organic layer 332 is not limited to the monomer.

The first organic layer 332 of the multilayer protection film 330 formed in such a manner that the first, second, third and fourth inorganic layers 331, 333, 335 and 337 and the first, second and third organic layers 332, 334 and 336 are alternately laminated may have a thickness that satisfies at least one of Expressions 1, 3 and 4.

Referring back to FIG. 1, the multilayer protection film 130 of the electronic device 100 may have various structures and materials in addition to the structures and materials described with reference to FIGS. 2, 3, 8 and 9. Various implementations of the multilayer protection film 130 will now be explained with reference to FIGS. 10, 11 and 12.

Figure 10:
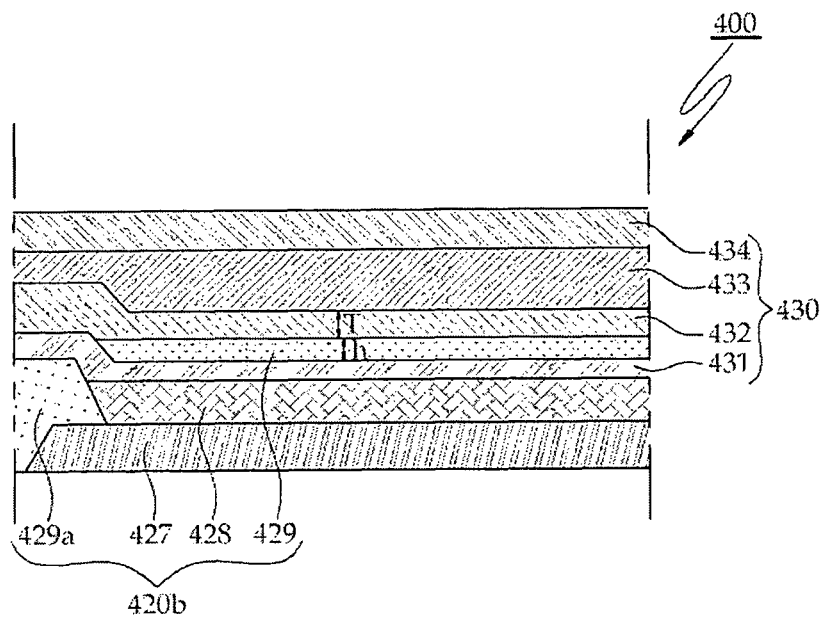
FIGS. 10, 11 and 12 are cross-sectional views of a diode and a multilayer protection film of another implementation of the electronic device.
Figure 11:
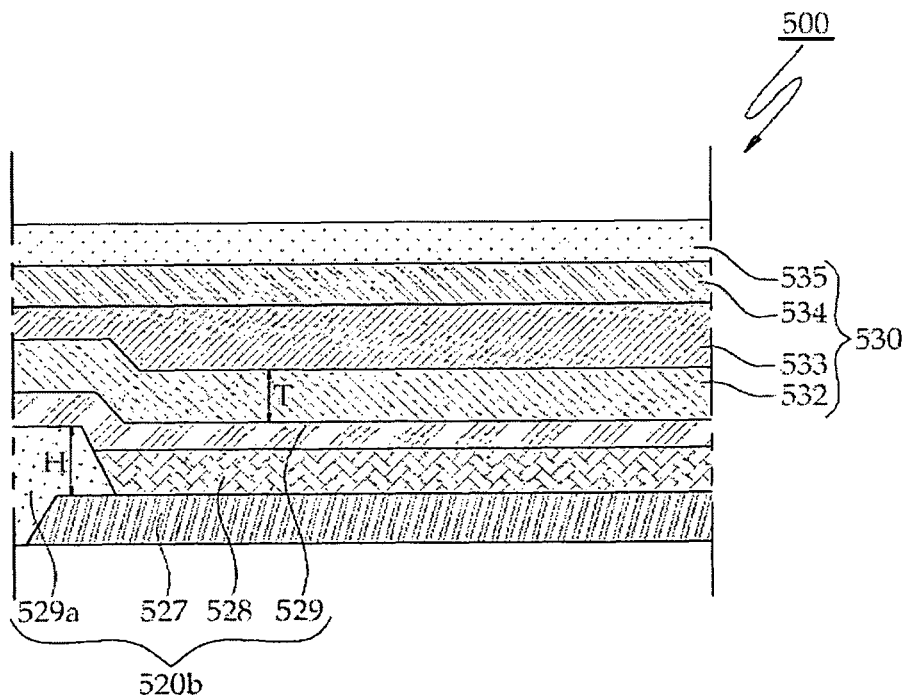
Figure 12:
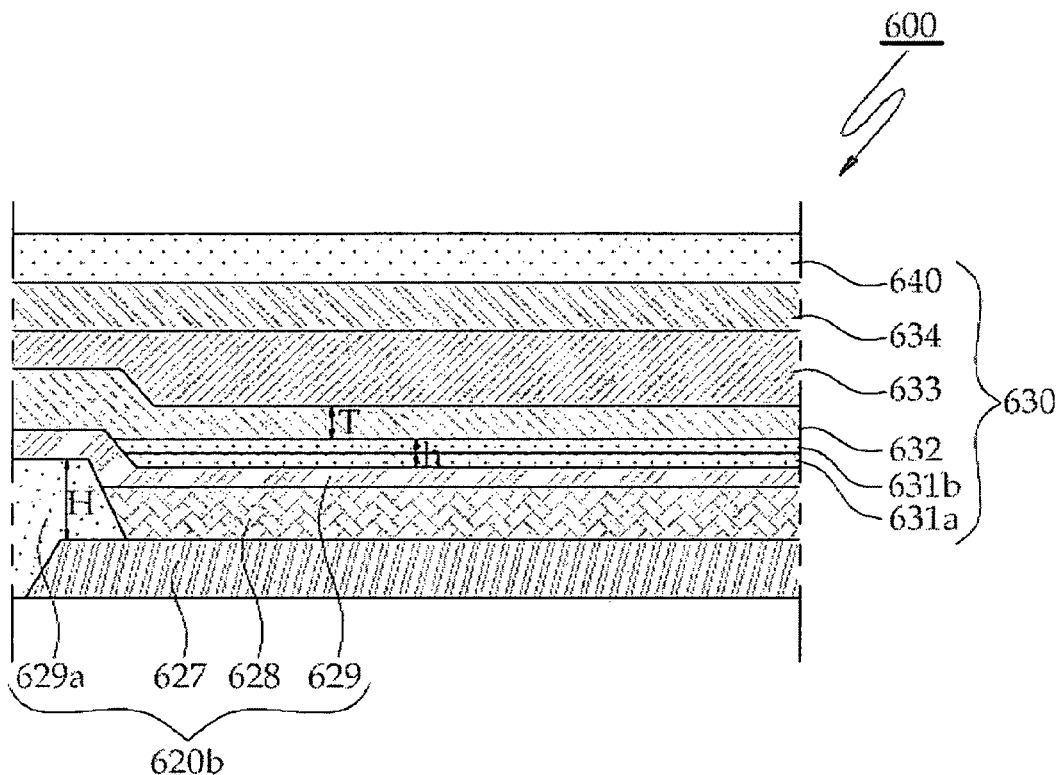

FIGS. 10, 11 and 12 are cross-sectional views of diodes and multilayer protection films of different implementations of the electronic device.

Referring to FIG. 10, an electronic device 400 includes a diode 420b and a multilayer protection film 430.

The diode 420b includes two electrodes 427 and 429 and a photolayer 428. The photolayer 428 may be a light emitting element such as an inorganic LED or an OLED or a light receiving element such as an organic solar cell. The diode 420b is discriminated from a neighboring diode according to a bank layer 429a having an opening.

The bank layer 429a having the opening is located on one of the two electrodes 427 and 429. The bank layer 429a is placed on the electrode 427 in this implementation. The photolayer 428 is formed in the opening of the photolayer 428. The other electrode 429 is formed on the photolayer 428.

The multilayer protection film 430 is formed on the electrode 429. The multilayer protection film 430 includes two or more layers for protecting the diode 420b from external physical and chemical impacts.

The multilayer protection film 430 includes two inorganic layers 431 and 433 and two organic layers 432 and 434. The multilayer protection film 430 is formed in such a manner that the two inorganic layers 431 and 433 and the two organic layers 432 and 434 are alternately laminated on the electrode 429. The organic layer 434 may be formed as the uppermost layer of the multilayer protection film 430 and a polarization film or a protection substrate may be formed on the organic layer 434.

The organic layer 432 has a thickness that satisfies Expressions 1, 2, 3 and 4.

Referring to FIG. 11, an electronic device 500 includes a diode 520b and a multilayer protection film 530.

The diode 520b includes two electrodes 527 and 529 and a photolayer 528. A bank layer 529a having an opening is formed on one of the two electrodes 527 and 529. The photolayer 528 is formed in the opening of the bank layer 529a. The photolayer 528 is placed on the electrode 529.

The multilayer protection film 530 is formed on the electrode 529. The multilayer protection film 530 includes two inorganic layers 533 and 535 and two organic layers 532 and 534. The multilayer protection film 530 is formed in such a manner that the inorganic layers 533 and 535 and the organic layers 532 and 534 are alternately laminated on the electrode 529. The organic layer 532 is formed as the first layer of the multilayer protection film 430 formed on the electrode 529 and the inorganic layer 535 is formed as the uppermost layer of the multilayer protection film 530.

In the electronic device 500, the organic layer 532 is the first layer of the multilayer protection film 530 formed on the electrode 529, and thus the thickness of the organic layer 532 is not affected by the thickness of an inorganic layer formed under the organic layer 532, which is distinguished from the aforementioned electronic devices. Accordingly, Expressions 2, 3 and 4 are modified into Expressions 6, 7 and 8.

$$K = k(fx)$$ [Expression 6]

Here, fx represents the flowability of the first organic layer 532, that is, a degree of flowing of the organic layer 532 from the bank layer 529a to the opening.

The thickness of the first organic layer 532 may be represented by Expression 7 derived from Expressions 1 through 6.

$$T \geq k(fx) \times H \times W$$ [Expression 7]

Here, T represents the thickness of the first organic layer 532. The thickness T of the first organic layer 532 is largely affected by the thickness H of the bank layer 529a, and thus Expression 7 can be simplified into Expression 8 if other variables are not considered.

$$T \geq H$$ [Expression 8]

Referring to Expressions 7 and 5, the thickness of the first organic layer 532 is determined by the height H of the bank layer 529a and the area W of the organic emission layer 528. Here, since the influence of the area W of the organic emission layer 528 on the first organic layer 532 is less than the influence of the height H of the bank layer 529a on the first organic layer 532, the thickness of the organic layer 532 is equal to or greater than the height H of the bank layer 529a if only the height H of the bank layer 529a is considered. In consideration of the area of the organic emission layer 528 in addition to the height of the bank layer 529a, the thickness of the organic layer 532 becomes greater than the height of the bank layer 529a in proportion to the height of the bank layer 529a as the area of the organic emission layer 528 increases.

Referring to FIG. 12, an electronic device 600 includes a diode 620b and a multilayer protection film 630.

The diode 620b and the multilayer protection film 630 have the same configurations as those of the diodes 420b and 520b and the multilayer protection films 430 and 530 of the electronic devices 400 and 500 shown in FIGS. 10 and 11.

First and second layers 631a and 631b are sequentially formed on an electrode 629 and located under a first organic layer 632 of the multilayer protection film 630. A polarization film or a protection substrate 640 may be placed on the uppermost layer 634 of the multilayer protection film 630.

The first layer 631a may be a moisture-absorbing layer. The moisture-absorbing layer 631a may be formed using a mask in a vacuum chamber. However, the method of forming the moisture-absorbing layer 631a is not limited thereto.

The moisture-absorbing layer 631a absorbs moisture infiltrated into the first organic layer 632 and other layers 633 and 634 located on the first organic layer 632 to protect pixels or sub-pixels from deterioration and prevent the lifetime of the pixels or sub-pixels from decreasing. The moisture-absorbing layer 631a may be formed of any material that can absorb moisture, for example, Li, Ca, Mg, Ba, Sr, Y and Cs.

When the moisture-absorbing layer 631a is formed of Ca, Ca reacts to moisture according to $2Ca+O_2+H_2O \rightarrow Ca(OH)_2+CaO$. That is, the moisture-absorbing layer 631a generates a transparent material when reacting to $H_2O$, and thus transmissivity of light projected from pixels or sub-pixels is not affected.

The multilayer protection films 130, 230, 330, 430, 530 and 630 may have various structures and materials and they are not limited to the structures and materials shown in FIGS. 1, 3, 9, 10, 11 and 12.

Figure 13:
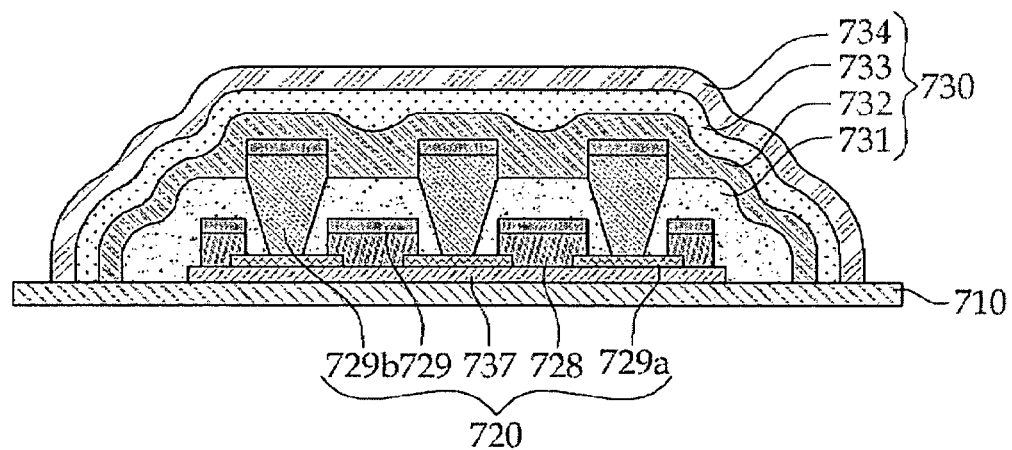
FIGS. 13 and 14 are cross-sectional views of another implementation of an organic light emitting device.
Figure 14:
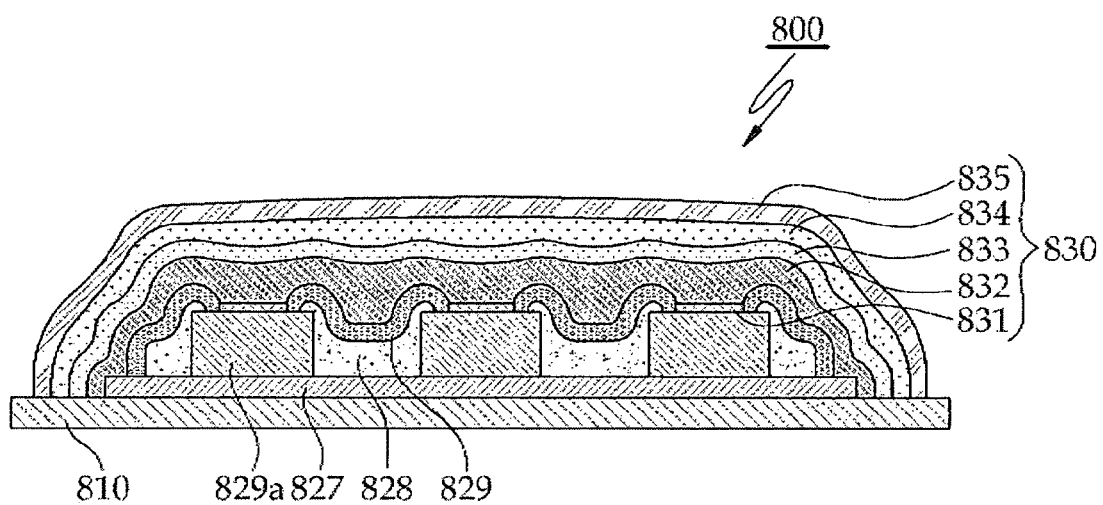

The multilayer protection films 130, 230, 330, 430, 530 and 630 may be applied to passive matrix OLEDs shown in FIGS. 13 and 14 as well as the AMOLEDs shown in FIGS. 2, 4 and 7.

FIGS. 13 and 14 are cross-sectional views of implementations of passive matrix OLEDs.

Referring to FIG. 13, an OLED 700 includes a substrate 710, first and second electrodes 727 and 729, an organic emission layer 728 placed between the first and second electrodes 727 and 729, and a multilayer protection film 730 formed on the second electrode 729.

The OLED 700 further includes a bank layer 729a having an opening, which divides the organic emission layer 728 into parts respectively corresponding to pixels or sub-pixels. The organic emission layer 728 is formed in the opening of the bank layer 729a, which is placed on the first electrode 727.

To form the second electrode 729 on the organic emission layer 728 without using a mask, a barrier 729b higher than the organic emission layer 728 is formed on the bank layer 729a. Accordingly, even if the second electrode 729 is deposited on the overall surface of the substrate 710 without using a mask, the second electrode 729 formed on the organic emission layer 728 is separated from a neighboring second electrode by the barrier 729b.

The multilayer protection film 730 is located on the barrier 729b and the second electrode 729 formed on the organic emission layer 728. A height difference between the bank layer 729a and the barrier 729b may cause the picture frame effect according to the thickness of a first organic layer 732 of the multilayer protection film 730 during a process of manufacturing the multilayer protection film 730.

Accordingly, the thickness of the first organic layer 732 may be equal to or greater than the heights of the bank layer 729a and the barrier 729b. The thickness of the first organic layer 723 is affected by the material of the first organic layer 732, the thickness of a layer 731 placed under the first organic layer 732 and the area of the organic emission layer 728, as described above.

Referring to FIG. 14, an OLED 800 is identical to the OLED 700 shown in FIG. 13 except that the OLED 800 does not include the barrier 729b. Accordingly, a bank layer 829a defines an organic emission layer 828 and a second electrode 829 is formed using a mask to be separated from a neighboring second electrode.

Accordingly, the thickness of a first organic layer 832 of a multilayer protection film 830 is affected by the height of the bank layer 829a, the material of the first organic layer 832, the thickness of a layer 831 placed under the first organic layer 832, and the area of the organic emission layer 828.

As described above, the multilayer protection film 130 shown in FIG. 1 is formed such that the thickness of the first organic layer satisfies the aforementioned expressions in proportion to the height of the bank layer formed to define the pixel 120 or a structure having the same function as the bank layer, the thickness of the layer under the first organic layer and the area of the pixel. Particularly, the thickness of the first organic layer is equal to or greater than the height of the structure for defining the pixel 120.

The above-described electronic devices include the multilayer protection films and do not generate the picture frame effect caused by an increase in the areas of the electronic devices. Pixels of the electronic devices can be protected from external physical and chemical impacts according to various multilayer protection film structures.

Furthermore, the aforementioned electronic devices can extend the lifetime of pixels and prevent the pixels from deterioration.

Moreover, the electronic devices can eliminate the picture frame effect to obtain a uniform pattern. In addition, mura and ununiform lighting due to the picture frame effect can be improved when an OLED is manufactured.

Other implementations are within the scope of the following claims.

The invention claimed is:

1. An electronic device comprising:
    a substrate;
    a pixel on the substrate and defined by a bank layer; and
    a multilayer protection film on the pixel and composed of multiple layers including at least two organic layers and at least two inorganic layers,
    wherein the thickness of the first organic layer of the multiple layers forming the multilayer protection film satisfies $T \geq k \times H \times W$ where T represents the thickness of the first organic layer, H denotes the height of the bank layer, W represents an area of an opening of the bank layer, and k is a constant that is varied according to flowability or viscosity of the first organic layer,
    wherein the organic layers and the inorganic layers in multiple layers are alternately laminated, and
    wherein the organic layers are not in contact with each other, the inorganic layers are not in contact with each other.

2. The electronic device of claim 1, wherein a layer is under the first organic layer and the constant k satisfies $k=k(fx, tm)$ where fx represents a variation according to the flowability or viscosity of the first organic layer and tm denotes the thickness of the layer located under the first organic layer.

3. The electronic device of claim 2, wherein the layer under the first organic layer is an inorganic layer that is formed of one or more selected from a group consisting of $Al_2O_3$, SiNx, $SiO_2$, SiNx, SiON, SiOxNy and SiC.

4. The electronic device of claim 1, wherein the electronic device is an organic electric device.

5. The electronic device of claim 1, wherein the organic electric device is one of an organic light emitting diode, an organic solar cell, an organic photoreceptor drum, an organic transistor (organic thin film transistor), a photodiode, an organic laser, or a laser diode.

6. The electronic device of claim 1, wherein the organic electric device is an organic light emitting diode and the pixel includes two electrodes and an organic emission layer interposed between the two electrodes.

7. The electronic device of claim 1, wherein the first organic layer comprises a monomer.

8. A multilayer protection film comprising:
an organic layer on a pixel defined by a bank layer and having a thickness that satisfies $T \geq k \times H \times W$ where T represents the thickness of the organic layer, W represents an area of an opening of the bank layer, H denotes the height of the bank layer and k satisfies $k=k(fx, tm)$ where fx represents a variation according to flowability or viscosity of the organic layer and tm denotes the thickness of an inorganic layer formed under the organic layer;
the inorganic layer under the organic layer; and
at least one organic layer and at least one inorganic layer on the organic layer,
wherein the organic layers and the inorganic layers are alternately laminated, and
wherein the organic layers are not in contact with each other, the inorganic layers are not in contact with each other.

9. The multilayer protection film of claim 8, wherein the organic layer comprises a monomer.

10. The multilayer protection film of claim 8, wherein the organic layer is formed of one or more selected from a group consisting of BCB, acryl, and PTN.

11. The multilayer protection film of claim 8, wherein the inorganic layer is formed of one or more selected from a group consisting of $Al_2O_3$, SiNx, $SiO_2$, SiNx, SiON, SiOxNy and SiC.

12. The multilayer protection film of claim 8, further comprising a moisture-absorbing layer located under the organic layer and the moisture-absorbing layer is formed of one or more selected from a group consisting of Li, Ca, Mg, Ba, Sr, Y, and Cs.

* * * * *